(12) United States Patent
Christensen

(10) Patent No.: US 8,868,010 B2
(45) Date of Patent: Oct. 21, 2014

(54) RF TRANSMITTER FOR ELECTRICALLY SHORT ANTENNA

(71) Applicant: Oticon A/S, Smørum (DK)

(72) Inventor: Kåre Tais Christensen, Smørum (DK)

(73) Assignee: Oticon A/S, Smorum (DK)

( * ) Notice: Subject to any disclaimer, the term of this patent is extended or adjusted under 35 U.S.C. 154(b) by 0 days.

(21) Appl. No.: 13/646,235

(22) Filed: Oct. 5, 2012

(65) Prior Publication Data

US 2013/0090074 A1     Apr. 11, 2013

Related U.S. Application Data

(60) Provisional application No. 61/543,821, filed on Oct. 6, 2011.

(30) Foreign Application Priority Data

Oct. 6, 2011 (EP) .................................. 11184079

(51) Int. Cl.
*H03C 1/52* (2006.01)
*H03J 1/00* (2006.01)

(52) U.S. Cl.
CPC ........... *H03J 1/0008* (2013.01); *H03J 2200/06* (2013.01)
USPC ............... 455/107; 455/82; 455/83; 455/264; 455/125; 375/218; 375/219

(58) Field of Classification Search
CPC ...................................................... H03J 1/0008
USPC ......... 455/107, 82, 83, 264, 125; 375/63, 219
See application file for complete search history.

(56) References Cited

U.S. PATENT DOCUMENTS

| | | | |
|---|---|---|---|
| 3,939,422 A | 2/1976 | Deise | |
| 4,339,827 A | 7/1982 | Torres et al. | |
| 4,689,803 A * | 8/1987 | Johannessen et al. | 375/304 |
| 5,402,133 A * | 3/1995 | Merenda | 343/701 |
| 6,049,702 A | 4/2000 | Tham et al. | |
| 6,307,441 B1 * | 10/2001 | Sharpe | 332/100 |
| 6,915,121 B2 | 7/2005 | Python et al. | |
| 7,239,713 B2 * | 7/2007 | Niederdrank | 381/317 |
| 7,508,898 B2 | 3/2009 | Cyr et al. | |
| 7,689,188 B2 * | 3/2010 | Rofougaran | 455/193.1 |
| 2009/0289743 A1 | 11/2009 | Rokhsaz | |

FOREIGN PATENT DOCUMENTS

GB             2179799 A      3/1987
WO    WO 2007/073068 A1   6/2007

* cited by examiner

*Primary Examiner* — Sanh Phu
(74) *Attorney, Agent, or Firm* — Birch, Stewart, Kolasch & Birch, LLP

(57) ABSTRACT

A synthetic-frequency RF transmitter is provided for transmitting an electromagnetic signal via an electrically short antenna. The transmitter comprises a reactive energy storage with an effective reactance adapted to form with the antenna a resonance circuit with a resonance frequency and a driver adapted to provide to the resonance circuit an electric transmission signal having an instantaneous frequency that varies in dependence on an information signal. The transmitter is characterized in that the transmitter is adapted to dynamically change the resonance frequency by changing the effective reactance in dependence on the information signal. Thus, the instantaneous pass-band of the resonance circuit may be controlled to substantially always comprise the instantaneous frequency of the electric transmission signal and thus of the electromagnetic signal.

19 Claims, 4 Drawing Sheets

RF TRANSMITTER FOR ELECTRICALLY SHORT ANTENNA

CROSS REFERENCE TO RELATED APPLICATIONS

This nonprovisional application claims the benefit of U.S. Provisional Application No. 61/543,821 filed Oct. 6, 2011, which claims priority under 35 U.S.C. 119(a) to Patent Application No. 11184079.9 filed in Europe on Oct. 6, 2011, all of which are hereby expressly incorporated by reference into the present application.

TECHNICAL FIELD

The present invention relates to a radio-frequency (RF) transmitter for transmitting electromagnetic signals via an electrically short antenna.

The invention may e.g. be useful in wireless communication involving portable and/or battery-operated apparatuses, such as wireless communication between hearing devices and auxiliary devices. Hearing devices may e.g. be hearing aids for compensating for a hearing-impaired person's loss of hearing capability or listening devices for augmenting a normal-hearing person's hearing capability.

BACKGROUND ART

RF antennas for transmission of electromagnetic signals are preferably designed to have a size of at least one quarter of the wavelength of the transmitted signal, since this generally allows high antenna efficiency, wide bandwidth and substantially real input impedance. However, many apparatuses do not have room for an antenna large enough to satisfy this condition. For an RF signal with a frequency of e.g. 100 MHz, one quarter of the wavelength equals 0.75 m. It is thus common to utilise antennas that are considerably smaller than one quarter of the wavelength. Such antennas are generally referred to as "electrically short" or "electrically small" antennas.

Electrically short antennas inherently exhibit low radiation resistance and low efficiency. Their efficiency may be increased by reducing resistive losses in the antenna, which, however, increases the quality factor (Q) of the antenna so that the bandwidth decreases. At a typical Q of 50, the 3-dB bandwidth of the antenna is 2% of the centre frequency.

U.S. Pat. No. 4,339,827 discloses a tuning circuit for tuning a relatively small loop antenna for receiving VHF (very high frequency) television signals, e.g. in a television set. The tuning circuit comprises a variable capacitance forming a resonance circuit with the antenna and responding to a control voltage. Further impedances may be coupled to the resonance circuit by means of electronic switches. The tuning circuit allows electronic tuning of the antenna pass-band to a selected television channel within the VHF band.

Similarly, U.S. Pat. No. 4,343,001 discloses a digitally tuned electrically small antenna, where tuning components switchable to various values are connected to a terminal of the antenna. A processor monitors the output of a phase discriminator connected to a second terminal of the antenna, commands switching of the tuning components until the antenna is in tune and stores the values reached for future reference. After some period of use, the processor may have learned to switch the antenna fast between different frequencies for transmission and/or reception of signals with a corresponding frequency.

In the receivers and the transmitter disclosed in the documents mentioned above, and in many other known RF devices with electrically short antennas, the usable channel bandwidth is limited by the width of the pass-band of the tuned antenna, since received and transmitted signals with a frequency outside the pass-band will be attenuated and phase-distorted strongly by the resonance circuit.

U.S. Pat. No. 5,402,133 discloses a synthesizer radiating system with a radiating element, which has dimensions which are small relative to the wavelength of the radiated frequency band. Energy dissipation is reduced by cycling stored energy back and forth between the radiating element and a reactive storage element. Wideband operation is achieved by actively controlling solid-state switching devices that modify the energy transfers between the radiating element and the storage element within the single cycles of the carrier signal. The synthesizer radiating system allows transmitting signals with a bandwidth exceeding that of a narrowband-tuned, electrically short antenna, however with a better efficiency than that of a comparable wideband-tuned antenna.

The disclosed synthesizer radiating system comprises relatively complex circuits for controlling the switching devices. Furthermore, the switching takes place at relatively high frequencies, which causes relatively high power losses in the electronic circuits that control the switching. Therefore, the disclosed system is less suitable for low-power transmitters wherein such losses in the control circuits could easily exceed the actual transmit power.

U.S. Pat. No. 7,239,713 discloses a hearing device with a radio device for narrow-band long-wave wireless transmission of information to another hearing device. An amplifier is connected to an antenna circuit comprising a parallel circuit of a coil and a capacitor. A feedback from the antenna circuit allows the amplifier and the antenna circuit to operate as an oscillator with a specific resonance frequency and a high Q, e.g. above 10. A further capacitor is connectable to the antenna circuit by means of a switch, whereby the resonance frequency is lowered. By switching in synchronisation with a data signal to be transmitted, the coil radiates a corresponding frequency-modulated (FM) data signal. A receiver circuit in the other hearing device adapts its frequency to the carrier frequency of the transmitted signal.

In the radio device disclosed in U.S. Pat. No. 7,239,713, the antenna circuit oscillates at its resonance frequency during transmission. In the following, a transmitter, wherein the resonance frequency of the antenna circuit determines the frequency of the transmitted signal, is referred to as a "natural-frequency transmitter".

In a natural-frequency transmitter, objects close to the antenna may affect the resonance frequency and the Q of the antenna circuit, and may thus also affect the frequency, the phase and the amplitude of the transmitted signal. In portable devices, such as e.g. hearing devices, in which low-frequency RF signals are utilised for wireless communication, the location and the electromagnetic properties of close-by objects are typically outside the control of the system designer. In such applications, the oscillator should therefore be designed to be robust against changes in impedances coupling with the antenna. Otherwise, the receiver must be able to adapt to changes of the signal frequency, phase and amplitude, which may put undesired limitations on e.g. the achievable communication range, the achievable data rate, the usable receiver circuit types, etc. This forces the designer to make a trade-off between low performance and complex radio circuits, the latter typically increasing both cost and power consumption. In systems utilising frequency-modulated signals, distortion of the transmitted frequency are reflected in the demodulated signal on the receiver side, thus worsening the problem.

Natural-frequency transmitters are generally difficult to design for robust operation, not least because the physical layout of the transmitter is critical. Sometimes, the oscillator even fails to oscillate at all, and it is not uncommon that the development of a natural-frequency transmitter requires the manufacture of several prototypes, which typically makes implementation of such transmitters in large-scale integrated circuits costly. Furthermore, minor changes to the design of a natural-frequency transmitter may have unforeseen consequences, which often prohibits successful reuse of a transmitter design in a new apparatus design.

It is an object of the present invention to provide an RF transmitter, which allows transmission of electromagnetic signals via an electrically short antenna without the above mentioned disadvantages.

Further objects are to provide a portable apparatus and a hearing aid comprising such a transmitter.

A further object is to provide a use of such a transmitter for transmission of electromagnetic signals via an electrically short antenna without the above mentioned disadvantages.

It is further an object to provide a method for operating an RF transmitter, which method allows transmission of electromagnetic signals via an electrically short antenna without the above mentioned disadvantages.

DISCLOSURE OF INVENTION

These and other objects of the invention are achieved by the invention defined in the independent claims and as explained in the following description. Further objects of the invention are achieved by the embodiments defined in the dependent claims and in the detailed description of the invention.

The invention is based on the use of a "synthetic-frequency transmitter", which in the context of the invention means a transmitter wherein the transmission frequency does not depend on the resonance frequency of the antenna circuit. In such a transmitter, the antenna circuit is forced to oscillate at the frequency of a transmission signal provided by a driver. The antenna circuit may amplify or attenuate the signal depending on how well the frequency of the transmission signal coincides with the resonance frequency of the antenna circuit, but it cannot alter the frequency. A synthetic-frequency transmitter thus allows achieving stable and predetermined transmission frequencies, e.g. by deriving these from a stable clock signal provided by e.g. a crystal oscillator. Thus, synthetic-frequency transmitters are easier to design for robust operation than natural-frequency transmitters, which reduces development time and costs. Furthermore, they are generally less complex and have lower power consumption than robust natural-frequency transmitters.

The inventors were seeking to increase the usable bandwidth of a synthetic-frequency RF transmitter comprising a reactive energy storage adapted to form a resonance circuit with an electrically short antenna to which the transmitter could be connected. The transmitter was intended for transmitting a frequency- or phase-modulated radio signal, i.e. for transmitting an electromagnetic signal in dependence on an electric transmission signal having an instantaneous frequency that varies in dependence on an information signal. Electrically short antennas are especially suitable for incorporation in small, portable devices, such as hearing devices.

The inventors furthermore desired to find a solution that neither causes higher complexity nor increased power consumption in the transmitter, which are important criteria, especially in battery-powered devices, such as hearing devices. Surprisingly, they found that such a solution may be achieved in a relatively simple way, namely by dynamically changing the resonance frequency of the resonance circuit by changing the effective reactance of the energy storage in dependence on the information signal. Thus, the instantaneous pass-band of the resonance circuit may be controlled to substantially always comprise the instantaneous frequency of the electric transmission signal. The found solution allows designing relatively simple transmitters in which the bandwidth of the transmitted signal may exceed that of the antenna circuit, so that broadband signals may be transmitted via a narrowband antenna with high efficiency. Furthermore, and contrary to what they initially presumed, the inventors found that the transmitter could be easily controlled and that the disadvantage of artefacts and distortions produced by the dynamic changing of the resonance frequency could be reduced to a level where they were more than compensated for by the advantages over the prior art solutions.

A relatively simple way of controlling the resonance frequency may be achieved by changing the effective reactance of the energy storage such that the resonance frequency of the resonance circuit shifts in the same direction as simultaneous shifts in the instantaneous frequency of the electric transmission signal.

By changing the effective reactance of the energy storage such that the resonance frequency of the resonance circuit substantially follows the instantaneous frequency of the electric transmission signal, higher efficiency may be achieved.

The effective reactance may be substantially capacitive, which allows the transmitter to be used for transmission via inductive electrically short antennas, such as loop antennas.

A digital control of the resonance frequency may be achieved if the energy storage comprises two or more reactance elements and one or more switches connected to allow reconfiguration of the reactance elements, and if the transmitter further changes the reactance at discrete points in time by operating at least one of the switches. Thus, reproducible reactance values may be quickly set.

The reactance elements are preferably capacitors. Capacitors may easily be incorporated in integrated circuits, allowing the entire transmitter or major parts hereof to be implemented in a single integrated circuit.

The energy storage may comprise a thermometer-coded array of storage circuits, each comprising one or more of the reactance elements. This allows for reducing the artefacts caused by operating the switches.

The energy storage may further comprise a binary-coded array of storage circuits, each comprising one or more of the reactance elements, the binary-coded array of storage circuits providing a finer resolution of reactance changes than the thermometer-coded array of storage circuits. This allows reducing the total number of reactance elements required to obtain a given range of resonance frequencies at a given frequency resolution, however without substantially increasing artefacts.

The transmitter may operate the switches such that at each discrete point in time, a minimum number of storage circuits in the thermometer-coded array of storage circuits is involved in the reactance change. This allows reducing artefacts in the transmitted electromagnetic signal.

The transmitter may further be adapted to time the operation of the one or more switches such that closing of switches takes place substantially when the voltages across the respective switches are at a minimum. This may further reduce artefacts in the transmitted electromagnetic signal.

The transmitter may comprise a receiver circuit connected to receive signals from the resonance circuit. This allows the transmitter to operate as a transceiver and further allows automatic tuning and calibration of the transmitter.

The transmitter may preferably be incorporated in a portable apparatus, e.g. a hearing device.

The transmitter may be used for transmitting an electromagnetic signal via an electrically short antenna.

A synthetic-frequency RF transmitter connected to an electrically short antenna and comprising a reactive energy storage with a reactance adapted to form with the antenna a resonance circuit with a resonance frequency may be operated by a method comprising: providing to the resonance circuit an electric transmission signal having an instantaneous frequency that varies in dependence on an information signal; and dynamically changing the resonance frequency by changing the effective reactance in dependence on the information signal. The method allows for transmitting electromagnetic signals via an electrically short antenna without the disadvantages of the prior art.

In the present context, a "hearing device" refers to a device, such as e.g. a hearing aid or an active ear-protection device, which is adapted to improve or augment the hearing capability of an individual by receiving acoustic signals from the individual's surroundings, modifying the acoustic signals electronically and providing audible signals to at least one of the individual's ears. Such audible signals may e.g. be provided in the form of acoustic signals radiated into the individual's outer ears, acoustic signals transferred as mechanical vibrations to the individual's inner ears through the bone structure of the individual's head and/or electric signals transferred directly or indirectly to the cochlear nerve of the individual. The hearing device may be configured to be worn in any known way, e.g. as a unit arranged behind the ear with a tube leading radiated acoustic signals into the ear canal or with a speaker arranged close to or in the ear canal, as a unit entirely or partly arranged in the pinna and/or in the ear canal, as a unit attached to a fixture implanted into the skull bone, etc. More generally, a hearing device comprises an input transducer for receiving an acoustic signal from an individual's surroundings and providing a corresponding electric input signal, a signal processing circuit for processing the electric input signal and an output transducer for providing an audible signal to the individual in dependence on the processed signal.

A "hearing system" refers to a system comprising one or two hearing devices, and a "binaural hearing system" refers to a system comprising one or two hearing devices and being adapted to provide audible signals to both of the individual's ears. Hearing systems or binaural hearing systems may further comprise "auxiliary devices", which communicate with the hearing devices and affect and/or benefit from the function of the hearing devices. Auxiliary devices may be e.g. remote controls, audio gateway devices, mobile phones, public-address systems, car audio systems or music players. Hearing devices, hearing systems or binaural hearing systems may e.g. be used for compensating for a hearing-impaired person's loss of hearing capability or augmenting a normal-hearing person's hearing capability.

As used herein, the singular forms "a", "an", and "the" are intended to include the plural forms as well (i.e. to have the meaning "at least one"), unless expressly stated otherwise. It will be further understood that the terms "has", "includes", "comprises", "having", "including" and/or "comprising", when used in this specification, specify the presence of stated features, integers, steps, operations, elements and/or components, but do not preclude the presence or addition of one or more other features, integers, steps, operations, elements, components and/or groups thereof. It will be understood that when an element is referred to as being "connected" or "coupled" to another element, it can be directly connected or coupled to the other element, or intervening elements may be present, unless expressly stated otherwise. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF THE DRAWINGS

The invention will be explained in more detail below in connection with preferred embodiments and with reference to the drawings in which.

The figures are schematic and simplified for clarity, and they just show details, which are essential to the understanding of the invention, while other details are left out. Throughout, like reference numerals and/or names are used for identical or corresponding parts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

MODE(S) FOR CARRYING OUT THE INVENTION

Figure 1:
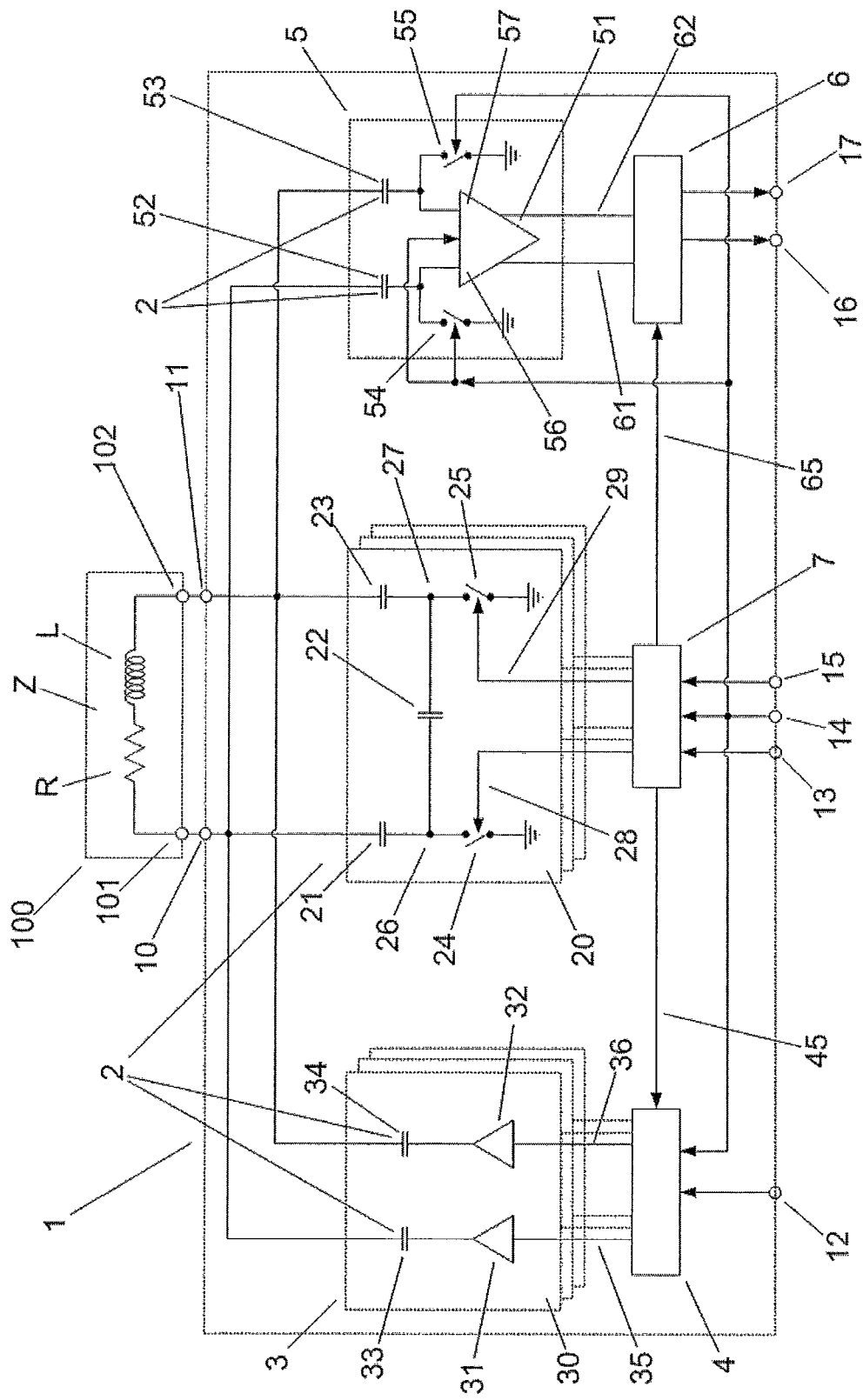
FIG. 1 shows an embodiment of a transmitter according to the invention.

The transmitter 1 shown in FIG. 1 comprises a reactive energy storage 2, a power amplifier 3, a modulator 4, a receiver circuit 5, a demodulator 6, a control unit 7, two antenna output terminals 10, 11 for providing an electric transmission signal, a clock terminal 12 for receiving a clock signal, a data input terminal 13 for receiving an information signal D (see FIG. 3), a mode input terminal 14 for receiving a mode control signal, a tuning input terminal 15 for receiving a tuning control signal, a receive data terminal 16 for providing a receive data signal and a calibration data terminal 17 for providing a calibration data signal.

The energy storage 2 comprises 257 storage circuits 20, one of which is shown in the figure, as well as a number of capacitors 33, 34, 52, 53 that are also comprised in respectively the power amplifier 3 and the receiver circuit 5. Each storage circuit 20 comprises three tuning capacitors 21, 22, 23 and two tuning switches 24, 25. The tuning capacitors 21, 22, 23 are connected in series between the antenna output terminals 10, 11, thereby defining a first and a second node 26, 27 between them. The first tuning switch 24 is connected between the first node 26 and ground. The second tuning switch 25 is connected between the second node 27 and ground. In each of the tuning switches 24, 25, a control input, which controls opening and closing of the respective tuning switch 24, 25, is connected to receive a respective tuning control signal through a respective tuning control line 28, 29 from the control unit 7. The transmitter 1 has a separate set of tuning control lines 28, 29 for each storage circuit 20.

The power amplifier 3 comprises seven identical dual amplifier circuits 30, one of which is shown in the figure. Each dual amplifier circuit 30 comprises two digital output stages 31, 32 and two output capacitors 33, 34. Each digital output stage 31, 32 has an input connected to receive a respective transmit signal from a respective output of the modulator 4 through a respective signal line 35, 36. Each digital output stage 31, 32 further has an output connected to provide an amplified output signal corresponding to the transmit signal on its input to a respective one of the antenna output terminals 10, 11 through a respective one of the output capacitors 33, 34. The transmitter 1 has a separate set of signal lines 35, 36 for each dual amplifier circuit 30. The output capacitors 33, 34 are also comprised in the reactive energy storage 2.

The modulator 4 is connected to receive the clock signal from the clock terminal 12, the mode control signal from the mode input terminal 14 and a transmit control signal through a transmit control line 45 from the control unit 7. The modulator 4 is further connected to provide the transmit signals to each of the signal lines 35, 36 for all of the dual amplifier circuits 30.

The receiver circuit 5 comprises a low-noise amplifier 51, two input capacitors 52, 53 and two mode switches 54, 55. Two complementary inputs 56, 57 of the low-noise amplifier 51 are each connected to a respective one of the antenna output terminals 10, 11 through a respective one of the input capacitors 52, 53. The first mode switch 54 is connected between the first input 56 and ground, and the second mode switch 55 is connected between the second input 57 and ground. In each of the mode switches 54, 55, a control input, which controls opening and closing of the respective mode switch 54, 55, is connected to receive the mode control signal from the mode input terminal 14. Two outputs of the low-noise amplifier 51 are connected to provide a differential receiver output signal to the demodulator 6 through two receiver output lines 61, 62. The low-noise amplifier 51 is further connected to receive the mode control signal from the mode input terminal 14. The input capacitors 52, 53 are also comprised in the reactive energy storage 2.

The demodulator 6 is connected to receive the differential receiver output signal from the receiver output lines 61, 62 as well as a receive control signal through a receive control line 65 from the control unit 7. The demodulator 6 is further connected to provide the receive data signal to the receive data terminal 16 and the calibration data signal to the calibration data terminal 17.

The control unit 7 is connected to receive the information signal D from the data input terminal 13, the mode control signal from the mode input terminal 14 and the tuning control signal from the tuning input terminal 15. The control unit 7 is further connected to provide individual tuning control outputs to each of the tuning control lines 28, 29 for all of the storage circuits 20, the transmit control signal to the transmit control line 45 and the receive control signal to the receive control line 65.

A loop antenna 100 external to the transmitter 1 comprises a conductor with one or more windings and two terminals 101, 102, which are each connected to a respective one of the antenna output terminals 10, 11 of the transmitter 1. The antenna 100 forms a complex impedance Z between the antenna output terminals 10, 11, which is modelled by a series connection of an inductor L and a resistor R. The inductance L, i.e. the imaginary part of the impedance Z, is primarily determined by the inductance of the windings of the loop antenna 100, but also comprises parasitic capacitive elements. The resistance R, i.e. the real part, is primarily determined by the inherent resistance of the conductor and the magnetic induction losses. The resistance R also comprises the radiation resistance of the antenna 100, which, however, is relatively small in an electrically short antenna.

The mode control signal, which must be supplied to the mode input terminal 14 by an external unit 304 (see FIG. 4), enables one of a transmit mode, in which an electromagnetic signal TX (see FIG. 3) may be transmitted by the transmitter 1, a calibration mode, which allows calibration and tuning of the transmitter 1, and a receive mode, in which an electromagnetic signal may be received by the transmitter 1. Each of the modulator 4, the receiver circuit 5, the demodulator 6 and the control unit 7 receives the mode control signal and reacts to the enabled mode as described in the following.

In the transmit mode and in the calibration mode, the modulator 4 is enabled. Furthermore, the mode switches 54, 55 are closed to connect the inputs 56, 57 of the low-noise amplifier 51 to ground, thus protecting them from high voltages provided by the power amplifier 3 to the antenna output terminals 10, 11. The mode switches 54, 55 are implemented as electronic switch elements, which inherently possess a very small, but nevertheless non-zero resistance and/or capacitance in their closed state. Each mode switch 54, 55 thus forms a voltage divider with the respective input capacitor 52, 53, which allows the low-noise amplifier 51 to receive signals from the antenna output terminals 10, 11, however strongly attenuated. In the calibration mode, the low-noise amplifier 51 is enabled to allow amplification of the attenuated signals. The demodulator 6 measures the amplitude and the phase of the received signal and provides the measurement results in the calibration data signal. In the transmit mode, the low-noise amplifier 51 is disabled so that its outputs as well as the receive data signal and the calibration data signal from the demodulator 6 are idle.

In the receive mode, the modulator 4 is disabled so that the transmit signals to the power amplifier 3 are idle. The outputs of the digital output stages 31, 32 are thus each tied to a power supply voltage, so that the output capacitors 33, 34 remain connected as substantive loads to the respective antenna output terminal 10, 11. Furthermore, the mode switches 54, 55 are open, so that the low-noise amplifier 51 may receive weak signals from the antenna output terminals 10, 11. The low-noise amplifier 51 amplifies the received signal and provides the amplified signals as a differential receiver output signal to the demodulator 6, which demodulates the differential receiver output signal in accordance with the information received in the receive control signal and provides demodulated data in the receive data signal.

The energy storage 2, which comprises the storage circuits 20 as well as the output capacitors 33, 34 and the input capacitors 52, 53, forms an effective storage capacitance C between the antenna output terminals 10, 11. The effective storage capacitance C further comprises contributions from parasitic capacitances in the transmitter 1, which may be caused by e.g. circuits for protection against electrostatic discharges (ESD). The effective capacitance C depends mainly on the states of the tuning switches 24, 25 in all of the storage circuits 20 and to a lesser degree on the states of the mode switches 54, 55, since the input capacitors 52, 53 are chosen relatively small.

Figure 2:
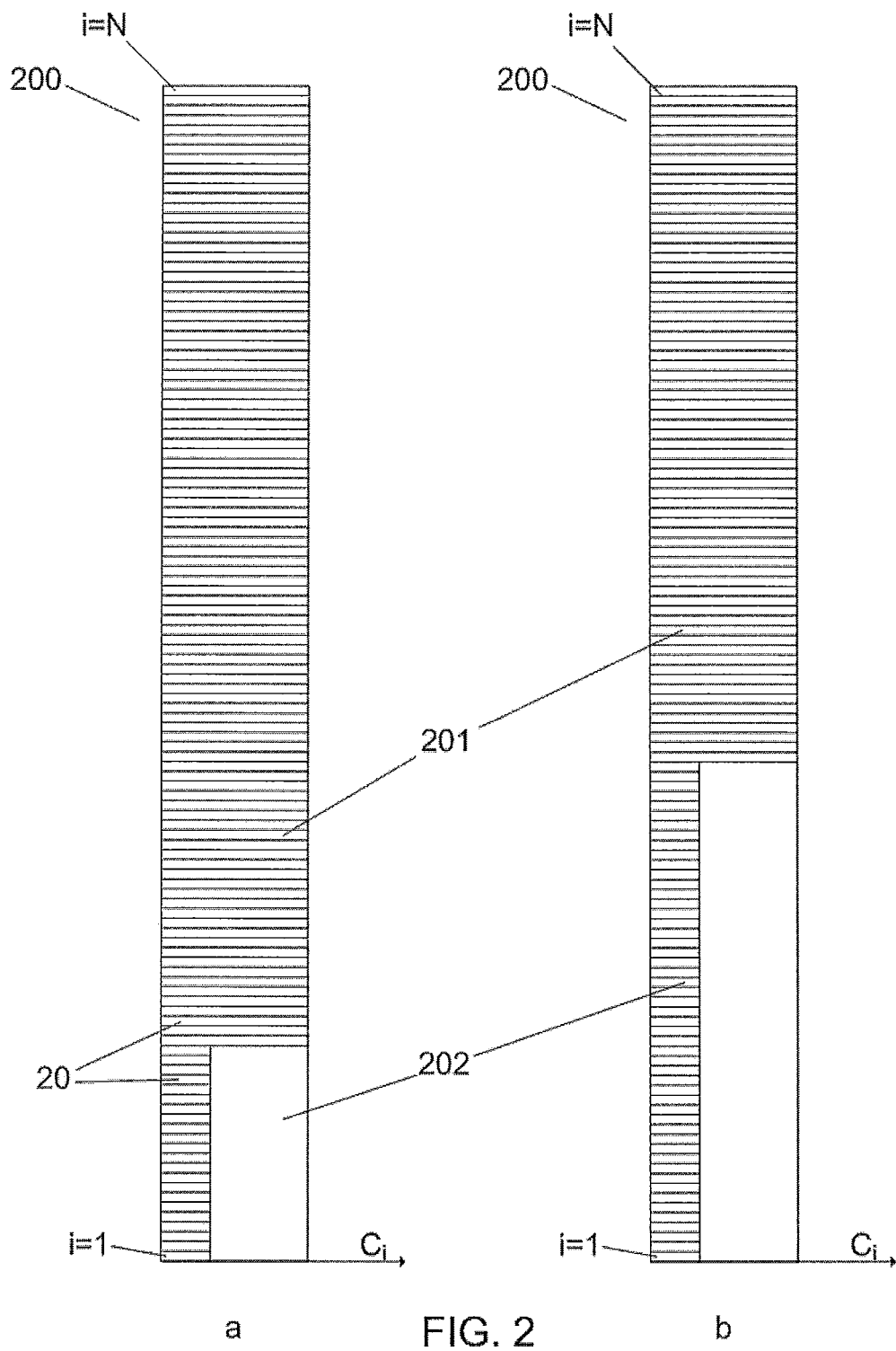
FIG. 2 shows a thermometer-coded array of storage circuits comprised in the transmitter of FIG. 1.

In the reactive energy storage 2, 255 of the 257 storage circuits 20 are identical and form a linearly-coded—or thermometer-coded—array 200 (see FIG. 2) of storage circuits 20. The function of the thermometer-coded array 200 is illustrated in FIG. 2. The individual storage circuits 20 are numbered from 1 to N. In the shown embodiment, N equals 255. Each storage circuit 20 is illustrated as a rectangle, the width of which is proportional to the effective capacitance $C_i$ of the storage circuit 20, i.e. the contribution of the storage circuit 20 to the effective storage capacitance C. The effective capacitance of the entire thermometer-coded array 200 is thus proportional to the area covered by the rectangles 20. The effective capacitance $C_i$ of each storage circuit 20 may be changed by operating, i.e. opening or closing, one or both of the tuning switches 24, 25 and thus reconfiguring the circuit formed by the tuning capacitors 21, 22, 23. At any time, the thermometer-coded array 200 comprises a (possibly empty) set 201 of storage circuits 20 momentarily having a higher effective capacitance $C_i$ and a (possibly empty) set 202 of storage circuits 20 momentarily having a lower effective capacitance $C_i$.

FIGS. 2a and 2b show the thermometer-coded array 200 in respectively a first and a second state. Since the set 201 of storage circuits 20 having a higher effective capacitance $C_i$ is larger in the first state than in the second state, the effective capacitance of the entire thermometer-coded array 200 is also larger in the first state than in the second state. When changing the effective capacitance of the entire thermometer-coded array 200 from one state (e.g. the first state) to another state (e.g. the second state), the control unit 7 operates the tuning switches 24, 25 such that the effective capacitance $C_i$ of a minimum of storage circuits 20 changes. This may be achieved by only adding storage circuits 20 to the set 201 of storage circuits 20 having a higher effective capacitance $C_i$ when increasing the effective storage capacitance C, and only removing storage circuits 20 from the set 201 of storage circuits 20 having a higher effective capacitance $C_i$ when decreasing the effective storage capacitance C. In other words, when increasing the effective storage capacitance C, none of the storage circuits 20 in the thermometer-coded array 200 are reconfigured to decrease their effective capacitance $C_i$ and vice versa. This allows keeping the electric noise caused by the switching at a minimum, which also allows reducing artefacts in the transmitted electromagnetic signal.

The effective capacitance of the entire thermometer-coded array 200 may be changed with a resolution corresponding to the possible change of the effective capacitance $C_i$ of a single storage circuit 20. An e.g. four times finer resolution across the same range could thus be achieved by using four times the number of storage circuits 20, each with quartered capacitances of the tuning capacitors 21, 22, 23. Instead—in order to save space and power in the transmitter 1, two of the 257 storage circuits 20 are implemented with respectively halved and quartered capacitances of the tuning capacitors 21, 22, 23 compared to the storage circuits 20 in the thermometer-coded array 200. These two storage circuits 20 form a binary-coded array of storage circuits 20, which allows a four times finer resolution at the cost of an only slightly increased switching noise.

The transmitter 1 is implemented in an integrated circuit (not shown). This not only allows reducing the circuit size and production costs, but also facilitates series production of transmitters 1 with reproducible properties.

Figure 3:
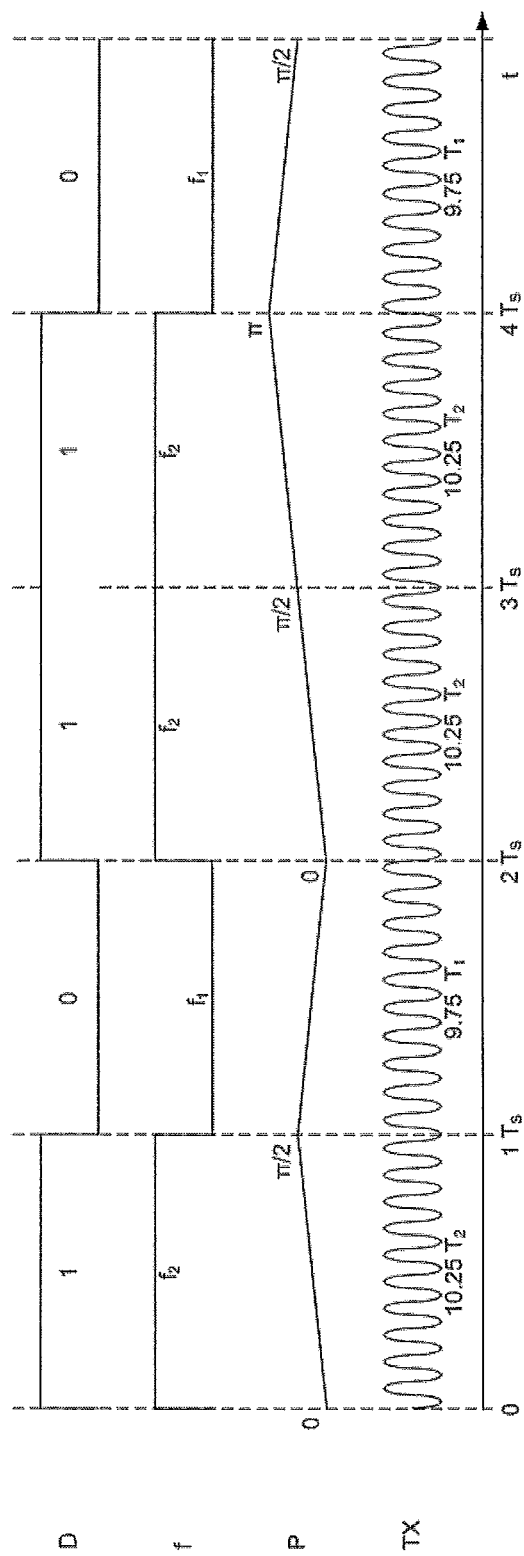
FIG. 3 shows example signals relating to the transmitter in FIG. 1.

FIG. 3 shows example signals for the transmit mode and the calibration mode along a time axis t. An information signal D comprises a stream of binary data or symbols (0/1) with a sample interval $T_s$ of e.g. 5 µs. An electromagnetic signal TX is transmitted at an instantaneous frequency f, which alternates between two transmit frequencies $f_1$, $f_2$ depending on the information signal D being respectively 0 or 1. The carrier frequency $f_c$, which is the mean of the transmit frequencies $f_1$, $f_2$, is 10 times the data rate (200 kHz) of the information signal D, e.g. 2 MHz. The modulation depth is 1/40, so that $f_1$ and $f_2$, respectively, equal 39/40 $f_c$ and 41/40 $f_c$, e.g. 1.95 MHz and 2.05 MHz. Consequently, 9.75 signal periods are transmitted during a 0-sample interval $T_s$ and 10.25 signal periods during a 1-sample interval $T_s$ so that the phase P of the transmitted electromagnetic signal TX shifts by plus or minus π/2 for each sample interval $T_s$. This modulation is commonly known as minimum-shift keying (MSK), which is a type of continuous-phase frequency-shift keying (CP-FSK). The relative 3 dB-bandwidth of the transmitted electromagnetic signal TX is about 1.2 times the relative data rate, i.e. about 1.2×200 kHz/2 MHz=about 12%.

The energy storage 2 and the antenna 100 form a resonance circuit with a resonance frequency $f_o$ given by $$f_0 = 1/(2\pi \cdot \sqrt{L \cdot C}), \quad (1)$$

a quality factor Q given by $$Q = (1/R_T + 1/R) \cdot \sqrt{L/C} \quad (2)$$

and a 3-dB bandwidth BW given by $$BW = f_1/Q \quad (3)$$

wherein L, C and R are defined as described further above, and $R_T$ is a resistance in series with one of the antenna output terminals 10, 11 which models losses in the transmitter 1. The equations are approximations that are valid for higher values of Q.

The antenna 100 and the transmitter 1 should be dimensioned such that the range of resonance frequencies $f_0$ obtainable by changing the effective storage capacitance C by means of the tuning switches 24, 25 comprises the entire frequency band of the electromagnetic signal TX to be transmitted by the transmitter 1. In the shown transmitter 1, the range of obtainable resonance frequencies $f_0$ comprises several such frequency bands, which allows tuning of the transmitter 1 to any one of a plurality of frequency channels. Alternatively, the range of obtainable resonance frequencies $f_0$ may be smaller than the range of transmit frequencies $f_1$, $f_2$, provided that the obtainable pass-bands comprise the transmit frequencies $f_1$, $f_2$.

The resonance circuit 2, 100 has a Q of 50 and thus has a relative 3-dB bandwidth of 2%. If the resonance frequency $f_0$ was kept at a fixed value, at least one of the transmit frequencies $f_1$, $f_2$ would thus be outside the 3-dB pass-band of the resonance circuit 2, 100. To avoid this, the transmitter changes the resonance frequency $f_0$ whenever the information signal D changes. The change is effected such that the instantaneous frequency f remains within the pass-band of the resonance circuit 2, 100. To achieve this, the resonance frequency $f_0$ is shifted in the same direction as the shifts in the instantaneous frequency f. Preferably, the change is effected such that the resonance frequency $f_0$ substantially always equals the instantaneous frequency f during transmission. The change in the resonance frequency $f_0$ is effected by changing the effective storage capacitance C. It should be noted that instead of 3 dB, any other suitable attenuation level in the resonance circuit 2, 100, e.g. 10 dB, could be used as criteria for determining whether the instantaneous frequency f is within the pass-band or not.

The tuning control signal, which must be supplied to the tuning input terminal 15 by an external unit 304 (see FIG. 4), indicates the frequency channel(s) to be used for transmission and reception as well as the modulation depth and the modulation type to be used.

In the receive mode, the control unit 7 computes the receive frequency from the receive channel indicated in the tuning control signal, indicates the receive frequency, the modulation depth and the modulation type in the receive control signal to the demodulator 6 and sets the resonance frequency $f_0$ to equal the receive frequency. In the receive mode, the transmitter 1 cannot take advantage of a dynamic change of the resonance frequency $f_0$, since this would require knowledge of the instantaneous frequency of the received signal before receiving it, and this information is obviously only available after receiving the signal.

In the transmit mode and the calibration mode, the control unit 7 computes the transmit frequencies $f_1$, $f_2$ from the transmit channel and the modulation depth indicated in the tuning control signal and indicates the desired transmit frequency $f_1$, $f_2$ in the transmit control signal to the modulator 4. The desired transmit frequency is either $f_1$ or $f_2$, depending on the state of the information signal D. The control unit 7 further sets the resonance frequency $f_0$ to always correspond with the desired transmit frequency $f_1$, $f_2$. The control unit 7 controls the effective storage capacitance C, and thereby also the resonance frequency $f_0$, through the tuning control signals provided to the tuning control lines 28, 29.

In an alternative embodiment (not shown), the demodulator 6 comprises a frequency-determining circuit for determining the instantaneous frequency of the signal received and amplified by the receiver circuit 5, and the control unit 7 sets the effective storage capacitance C in dependence on the determined instantaneous frequency. The instantaneous frequency may alternatively be determined from any other signal provided to or by the power amplifier 3, such as a modulator output or the electric transmission signal. In such alternative embodiments, the modulator 4 may be controlled by, or be part of, an external unit.

When a change of the effective storage capacitance C is required to change the resonance frequency $f_0$, the control unit 7 opens and/or closes the tuning switches 24, 25 in a subset of the storage circuits 20. This causes a reconfiguration of the respective storage circuits 20 so that they alter their effective capacitance $C_i$. In order to avoid losing energy in the energy storage 2 and/or producing glitches during switching, the control unit 7 controls the timing of switch closings such that they take place when the respective tuning switch 24, 25 has a minimum voltage across its terminals. In the disclosed embodiment, the power supply voltages are asymmetric with respective to ground, e.g. 1.25 V and 0 V respectively, and the tuning switches 24 and 25 of each storage circuit 20 must thus be closed at different points in time to achieve this. In embodiments with symmetric supply voltages, the control unit 7 may instead close the tuning switches 24 and 25 simultaneously. In the disclosed embodiment, the effective capacitance $C_i$ of each storage circuit 20 increases when the control unit 7 closes the tuning switches 24, 25 and decreases when it opens the tuning switches 24, 25. The intermediate capacitor 22 ensures that the voltage across an open tuning switch 24, 25 does not reach the high levels present on the antenna output terminals 10, 11.

In the disclosed embodiment, the effective reactance between the antenna output terminals 10, 11 substantially equals the effective storage capacitance C and is thus substantially capacitive. Also, the individual reactance elements, i.e. the tuning capacitors 21, 22, 23, comprised in the energy storage 2 are substantially capacitive. The energy storage 2 may, however, additionally or alternatively comprise one or more inductive reactance elements, such as inductors.

The modulator 4 uses the clock signal to derive a stable time reference for the transmit signals provided to the digital output stages 31, 32. The transmit signals are provided as square-wave signals. The modulator 4 provides the transmit signals so that the instantaneous fundamental frequency f of the electric transmission signal provided by the power amplifier 3 to the antenna output terminals 10, 11 equals the desired transmit frequency indicated in the transmit control signal.

The output of each digital output stage 31, 32 alternates between a supply voltage and ground in dependence on the transmit signal on its input. These square-wave output signals are led to the antenna output terminals 10, 11 through the output capacitors 33, 34, which cooperate with the other capacitances in the transmitter 1 to form impedance transformers. This allows the amplitude at the antenna output terminal 10, 11 to exceed the amplitudes on the outputs of the output stages 31, 32.

The modulator 4 provides the transmit signals such that within each dual amplifier circuit 30, the digital output stage 31, 32 receive transmit signals that are inverted with respect to each other. Thus, each dual amplifier circuit 30 provides an either positive or negative contribution to the differential voltage across the antenna output terminals 10, 11. The availability of seven identical dual amplifier circuits 30 allow controlling the output of the power amplifier 3 to any one of a number of different levels by controlling the timing of transitions in the transmit signals, or alternatively or additionally idling one or more of the transmit signals. The output of the power amplifier 3 may further be shaped to reduce the amount of radiated harmonics. To achieve this, the modulator 4 may control the transitions in the transmit signals on the individual signal lines 35, 36 such that the electric transmission signal to the antenna 100 is as close to a pure sine wave signal as possible during each sample interval $T_s$. The resonance circuit 2, 100 further functions as a steep band-pass filter, which suppresses a major portion of the harmonics.

The demodulator 6 demodulates the differential receiver output signal according to the receive frequency, the modulation depth and the modulation type indicated in the receive control signal from the control unit 7. Preferably, the received signal is modulated with the same type of modulation as is applied to the transmitted electromagnetic signal TX, and the data rates used for transmission and reception of signals are equal. In this case, the receiver 5 and/or the demodulator 6 may comprise means (not shown) for improving reception of electromagnetic signals residing outside the 3-dB pass-band of the resonance circuit 2, 100. Such means may comprise e.g. a filter adapted to at least partly compensate for the amplitude and phase changes caused by the resonance circuit 2, 100. Such means are e.g. described in the co-pending patent application EP 2 367 294. Alternatively, the transmitter 1 may be used for receiving signals with a data rate smaller than the transmitted data rate. In this case, means for improving out-of-band reception may be omitted. The demodulator 6 may derive a time base for demodulation from the received signal or, alternatively, from the clock signal. In the latter case, the clock signal should also be routed from the clock terminal 12 to the demodulator 6.

The receiver circuit 5 allows the transmitter 1 to operate as a half-duplex transceiver by switching between the receive mode and the transmit and/or the calibration mode. In the calibration mode, the receiver circuit 5 further allows an external unit 304 (see FIG. 4) to monitor the amplitude and/or phase of the electric transmission signal on the antenna output terminals 10, 11 and thus to achieve a calibrated transmitter output as well as to tune the resonance frequency of the resonance circuit 2, 100 by methods already known in the art. The transmitter 1 may alternatively comprise own means for monitoring the amplitude and/or phase of the electric transmission signal, such as a circuit in the demodulator 6. The control unit 7 may receive an output of such means and automatically change the effective storage capacitance C to achieve maximum amplitude of the electric transmission signal during transmission. Such automatic adjustment or calibration of the resonance circuit 2, 100 may take place continuously during transmission, at specific time intervals, e.g. once per minute, hourly, daily or weekly, or at specific events, such as upon start-up of the transmitter 1. Instead of a full-power transmitted signal, transmission of a weaker test signal may be used for calibration.

Figure 4:
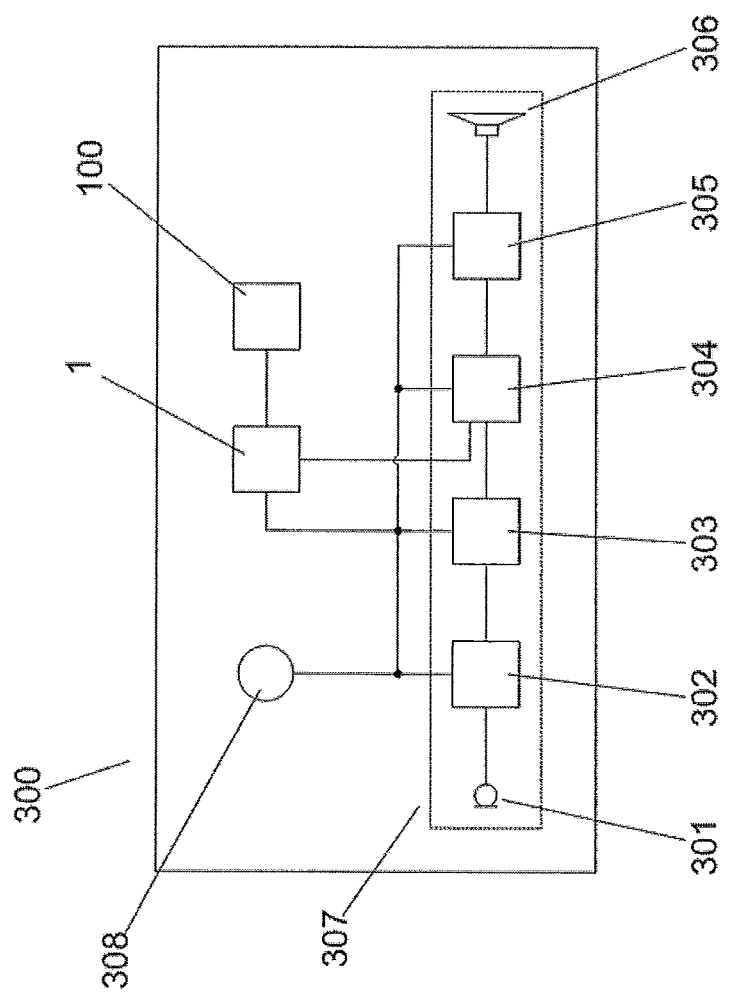
FIG. 4 shows an embodiment of a hearing device comprising the transmitter of FIG. 1.

FIG. 4 shows a hearing device 300, e.g. a hearing aid or an active ear-protection device, comprising a transmitter 1 and a loop antenna 100 configured as described above. The hearing device 300 further comprises a microphone 301, a preamplifier 302, a digitiser 303, a signal processor 304, a pulse-width modulator 305 and a speaker 306 connected to form an audio signal path 307. The hearing device 300 further comprises a battery 308 for powering the transmitter 1 and the devices 302, 303, 304, 305 in the audio signal path 307. The microphone 301 is arranged to receive an acoustic input signal from an individual's surroundings and provide a corresponding microphone signal to the preamplifier 302. The preamplifier 302 is adapted to amplify the microphone signal and provide the amplified microphone signal to the digitiser 303. The digitiser 303 is adapted to digitise the amplified microphone signal and provide a digitised audio signal to the signal processor 304, which is adapted to modify the digitised audio signal in accordance with the purpose of the hearing device 300, i.e. to improve or augment the hearing capability of the individual. The audio signal processor 304 is adapted to provide the modified audio signal to the pulse-width modulator 305, which is adapted to provide a corresponding pulse-width modulated signal to the speaker 306. The hearing device 300 is adapted to be arranged at or in an ear of the individual, and the speaker 306 is arranged to transmit an acoustic output signal corresponding to the pulse-width modulated signal to the individual.

The signal processor 304 is connected to receive the receive data signal from the receive data terminal 16 of transmitter 1 and the calibration data signal from the calibration data terminal 17 of transmitter 1. The signal processor 304 is adapted to adjust its modification of the digitised audio signal in response to information comprised in the receive data signal and/or to provide the modified audio signal in dependence on an audio signal comprised in the receive data signal. This allows the hearing device 300 to change its audio signal processing in response to e.g. commands, status information and/or audio signals received wirelessly in a electromagnetic signal from a remote device (not shown), and/or to include such audio signals in the acoustic signal transmitted by the speaker 306. The remote device could e.g. be a remote control, a second hearing device located at or in the respective other ear of the individual or an auxiliary device, e.g. a so-called audio gateway device, adapted to transmit an audio signal from an external device, such as e.g. a mobile phone or a TV set, to the hearing device 300.

The signal processor 304 further is connected to the clock terminal 12, the mode input terminal 14 and the tuning input terminal 15 of the transmitter 1 and further is adapted to provide the corresponding signals for controlling the transmitter 1 as described further above. The signal processor 304 further is connected to the data input terminal 13 of the transmitter 1 and further is adapted to provide the information signal D comprising information such as commands, status information, control signals and/or audio signals to the transmitter 1 for transmission to a remote device, which could e.g. be another hearing device for the opposite ear or an auxiliary device.

The audio signal path 307 is preferably implemented mainly as digital circuits operating in the discrete time domain, but any or all parts hereof may alternatively be implemented as analog circuits operating in the continuous time domain. Digital functional blocks of the audio signal path 307 and/or of the transmitter 1 may be implemented in any suitable combination of hardware, firmware and software and/or in any suitable combination of hardware units. Furthermore, any single hardware unit may execute the operations of several functional blocks in parallel or in interleaved sequence and/or in any suitable combination thereof.

The hearing device 300 may be part of a binaural hearing system.

The transmitter 1 may be used in any type of device, most advantageously in battery-driven and/or portable devices.

Further modifications obvious to the skilled person may be made to the disclosed method, system and/or device without deviating from the spirit and scope of the invention. Within this description, any such modifications are mentioned in a non-limiting way. The possible modifications below are mentioned as examples hereof.

The energy storage 2 and/or the storage circuits 20 may configured in many alternative ways, while still allowing dynamic change of the effective storage reactance C. More specifically, the number of storage circuits 20 may vary; this applies to the total number of storage circuits 20, the number of storage circuits 20 in the thermometer-coded array 200 as well as the number of storage circuits 20 in the binary-coded array.

The power amplifier 3 may alternatively comprise analog output stages. The amplifier circuits 30 may comprise only a single-output output stage. The number of amplifier circuits 30 may vary, and the individual amplifier circuits 30 may differ from each other, e.g. in maximum power.

The control unit 7 as well as the content and routing of control signals associated herewith may be implemented in many alternative ways. For instance, the transmit control signal and the receive control signal may be provided by external units.

Alternatively to MSK, any form of frequency or phase modulation may be used for modulating the information signal onto the carrier signal. Such modulation forms include e.g. analog frequency modulation, analog phase modulation, phase-shift keying, frequency-shift keying and combinations hereof. These modulation forms allow both analog and digital information signals to be modulated onto the carrier signal. Especially preferred modulation techniques comprise minimum shift keying and other of the various known modulation techniques that reduce the bandwidth of the transmitted electromagnetic signal TX and thus allow the modulated signal to pass the resonance circuit 2, 100 with minimum attenuation and/or require less dynamic change of the a resonance frequency $f_0$. The power amplifier 3, the modulator 4, the receiver circuit 5, the demodulator 6 and the control unit 7 may obviously need to be adapted to such altered modulation forms.

Furthermore, the sample interval $T_s$, the carrier frequency $f_c$, the relative data rate and the modulation depth may be chosen quite freely. For instance, the carrier frequency $f_c$ may be below 100 MHz, below 30 MHz or below 10 MHz.

The transmitter 1 may be implemented such that it allows the resonance circuit 2, 100 to have a relative 3 dB-bandwidth less than 10% (Q>10), less than 5% (Q>20), less than 3% (Q>~33) or less than 2% (Q>50), depending on e.g. the carrier frequency $f_c$, the bandwidth of the information signal D, the desired communication range, the acceptable bit error rate as well as other requirements for the communication link in which the transmitter 1 is to be used.

The transmitter 1 may be implemented such that it allows the resonance circuit 2, 100 to be tuned to a resonance frequency $f_0$ below 100 MHz, below 30 MHz or below 10 MHz, depending primarily on the desired range of carrier frequencies $f_c$. A lowering of the frequency generally causes lower power consumption. The resonance circuit 2, 100 should, however, preferably be tuned to form a narrow band-pass filter with a resonance frequency $f_0$ above 300 kHz, above 1 MHz or above 3 MHz in order to allow a high data rate (bits per second) in the communication link. Preferred data rates are above 40 kb/s, above 80 kb/s or above 160 kb/s in order to allow transmission and reception of real-time audio signals through the transmitter 1.

The antenna 100 and/or the transmitter 1 may be dimensioned to have a largest physical extension of less than 5 cm, less than 2 cm or less than 1 cm. Small dimensions allow implementation in small devices. The transmitter 1 may further be dimensioned to having a power consumption less than 10 mW, less than 3 mW or less than 1 mW. This allows use of the transmitter 1 in battery-powered devices, such as body-worn hearing devices 300.

Stable transmit frequencies $f_1$, $f_2$ may be derived from e.g. a system clock signal within the device 300 in which the transmitter 1 is comprised. Alternatively, the transmit frequencies $f_1$, $f_2$ may be derived from a dedicated oscillator, e.g. a crystal oscillator or any other oscillator.

Some preferred embodiments have been described in the foregoing, but it should be stressed that the invention is not limited to these, but may be embodied in other ways within the subject-matter defined in the following claims. For example, the features of the described embodiments may be combined arbitrarily, e.g. in order to adapt the system, the devices and/or the method according to the invention to specific requirements.

It is further intended that the structural features of the system and/or devices described above, in the detailed description of 'mode(s) for carrying out the invention' and in the claims can be combined with the methods, when appropriately substituted by a corresponding process. Embodiments of the methods have the same advantages as the corresponding systems and/or devices.

Any reference numerals and names in the claims are intended to be non-limiting for their scope.

The invention claimed is:

1. A synthetic-frequency RF transmitter for transmitting an electromagnetic signal via an electrically short antenna, the transmitter comprising:
   a reactive energy storage, having a capacitive component and/or an inductive component, with an effective reactance, adapted to form with the antenna a resonance circuit with a resonance frequency; and
   a driver adapted to provide to the resonance circuit an electric transmission signal having an instantaneous frequency that varies in dependence on an information signal,
   wherein the transmitter is adapted to dynamically change the resonance frequency by changing the effective reactance in dependence on the information signal, and
   the effective reactance is capacitive.

2. A hearing device, comprising:
   a microphone that converts a sound into an electrical input signal;
   a digitizer configured to convert the electrical input signal into an information signal;
   a synthetic-frequency RF transmitter for transmitting an electromagnetic signal via an electrically short antenna; and
   the electrically short antenna, wherein
   the transmitter includes
      a reactive energy storage with an effective reactance adapted to form with the antenna a resonance circuit with a resonance frequency; and
      a driver adapted to provide to the resonance circuit an electric transmission signal having an instantaneous frequency that varies in dependence on the information signal,
      wherein the transmitter is adapted to dynamically change the resonance frequency by changing the effective reactance in dependence on the information signal, and
   the transmitter is further adapted to change the effective reactance such that the resonance frequency shifts in the same direction as simultaneous shifts in the instantaneous frequency.

3. A hearing device, comprising:
   a microphone that converts a sound into an electrical input signal;
   a digitizer configured to convert the electrical input signal into an information signal;
   a synthetic-frequency RF transmitter for transmitting an electromagnetic signal via an electrically short antenna; and
   the electrically short antenna, wherein
   the transmitter includes
      a reactive energy storage with an effective reactance adapted to form with the antenna a resonance circuit with a resonance frequency; and
      a driver adapted to provide to the resonance circuit an electric transmission signal having an instantaneous frequency that varies in dependence on the information signal,
      wherein the transmitter is adapted to dynamically change the resonance frequency by changing the effective reactance in dependence on the information signal, and
   the transmitter is further adapted to change the effective reactance such that the resonance frequency substantially follows the instantaneous frequency.

4. A synthetic-frequency RF transmitter for transmitting an electromagnetic signal via an electrically short antenna, the transmitter comprising:
   a reactive energy storage with an effective reactance adapted to form with the antenna a resonance circuit with a resonance frequency; and
   a driver adapted to provide to the resonance circuit an electric transmission signal having an instantaneous frequency that varies in dependence on an information signal,
   wherein the transmitter is adapted to dynamically change the resonance frequency by changing the effective reactance in dependence on the information signal, wherein
   the energy storage comprises two or more reactance elements and one or more switches connected to allow reconfiguration of the reactance elements, and wherein the transmitter further is adapted to change the effective reactance at discrete points in time by operating at least one of the switches.

5. Transmitter according to claim 4, wherein the reactance elements are capacitors.

6. Transmitter according to claim 4, wherein the energy storage comprises a thermometer-coded array of storage circuits, each comprising one or more of the reactance elements.

7. Transmitter according to claim 6, wherein the energy storage further comprises a binary-coded array of storage circuits, each comprising one or more of the reactance elements, the binary-coded array of storage circuits providing a finer resolution of effective reactance changes than the thermometer-coded array of storage circuits.

8. Transmitter according to claim 6 and further adapted to operate the switches such that at each discrete point in time, a minimum number of storage circuits in the thermometer-coded array of storage circuits is involved in the effective reactance change.

9. Transmitter according to claim 4, wherein
the transmitter further is adapted to time the operation of the one or more switches such that closing of switches takes place substantially when the voltages across the respective switches are at a minimum.

10. A synthetic-frequency RF transmitter for transmitting an electromagnetic signal via an electrically short antenna, the transmitter comprising:
a reactive energy storage with an effective reactance adapted to form with the antenna a resonance circuit with a resonance frequency;
a driver adapted to provide to the resonance circuit an electric transmission signal having an instantaneous frequency that varies in dependence on an information signal; and
a receiver circuit connected to receive signals from the resonance circuit,
wherein the transmitter is adapted to dynamically change the resonance frequency by changing the effective reactance in dependence on the information signal.

11. Portable apparatus comprising a transmitter according to claim 1.

12. Hearing device comprising a transmitter according to claim 1.

13. A method for operating a synthetic-frequency RF transmitter connected to an electrically short antenna, the transmitter comprising a reactive energy storage, having a capacitive component and/or an inductive component, with an effective reactance, adapted to form with the antenna a resonance circuit with a resonance frequency, the method comprising:

providing to the resonance circuit an electric transmission signal having an instantaneous frequency that varies in dependence on an information signal;
dynamically changing the resonance frequency by changing the effective reactance in dependence on the information signal; and
providing that the effective reactance is capacitive.

14. The synthetic-frequency RF transmitter according to claim 1, wherein
the transmitter is configured to change the effective reactance such that the resonance frequency shifts in the same direction as simultaneous shifts in the instantaneous frequency.

15. The synthetic-frequency RF transmitter according to claim 1, wherein
the transmitter is configured to change the effective reactance such that the resonance frequency substantially follows the instantaneous frequency.

16. The synthetic-frequency RF transmitter according to claim 4, wherein
the transmitter is configured to change the effective reactance such that the resonance frequency shifts in the same direction as simultaneous shifts in the instantaneous frequency.

17. The synthetic-frequency RF transmitter according to claim 4, wherein
the transmitter is configured to change the effective reactance such that the resonance frequency substantially follows the instantaneous frequency.

18. The method of operating the synthetic-frequency RF transmitter according to claim 13, further comprising:
changing the effective reactance such that the resonance frequency shifts in the same direction as simultaneous shifts in the instantaneous frequency.

19. The method of operating the synthetic-frequency RF transmitter according to claim 13, further comprising:
changing the effective reactance such that the resonance frequency substantially follows the instantaneous frequency.

* * * * *